United States Patent [19]

Reusch

[11] Patent Number: 4,534,105
[45] Date of Patent: Aug. 13, 1985

[54] METHOD FOR GROUNDING A PELLET SUPPORT PAD IN AN INTEGRATED CIRCUIT DEVICE

[75] Inventor: Raymond K. Reusch, Basking Ridge, N.J.

[73] Assignee: RCA Corporation, Princeton, N.J.

[21] Appl. No.: 521,897

[22] Filed: Aug. 10, 1983

[51] Int. Cl.³ .................. H01L 23/50; H01L 23/12
[52] U.S. Cl. .................................. 29/589; 29/571; 29/591; 29/577 R; 29/577 C; 148/1.5; 357/70; 357/75; 357/80; 174/52 FP; 174/52 R
[58] Field of Search ............... 29/589, 590, 591, 571, 29/577 R, 577 C; 148/1.5; 357/70, 75, 80; 174/52 FP, 52 R, 68.5

[56] References Cited

U.S. PATENT DOCUMENTS 3,611,061 10/1971 Segerson ..................... 29/589 X
3,685,137 8/1972 Gardiner ..................... 29/471.3
4,065,851 1/1978 Kummer et al. ............. 29/630 R
4,068,371 1/1978 Miller ........................ 29/628
4,355,082 10/1982 Bischoff et al. ............. 29/590 X
4,403,240 9/1983 Seki et al. .................. 357/48
4,454,529 6/1984 Philofsky et al. ............ 357/70 X

FOREIGN PATENT DOCUMENTS 2091035 7/1982 United Kingdom ............ 357/70

Primary Examiner—Brian E. Hearn
Assistant Examiner—David A. Hey
Attorney, Agent, or Firm—Birgit E. Morris; Donald S. Cohen; James M. Trygg

[57] ABSTRACT

An improved method of grounding a pellet mounting pad is disclosed wherein the ground wire is bonded to one of the structural support members of the mounting pad rather than to the surface of the pad itself.

12 Claims, 3 Drawing Figures

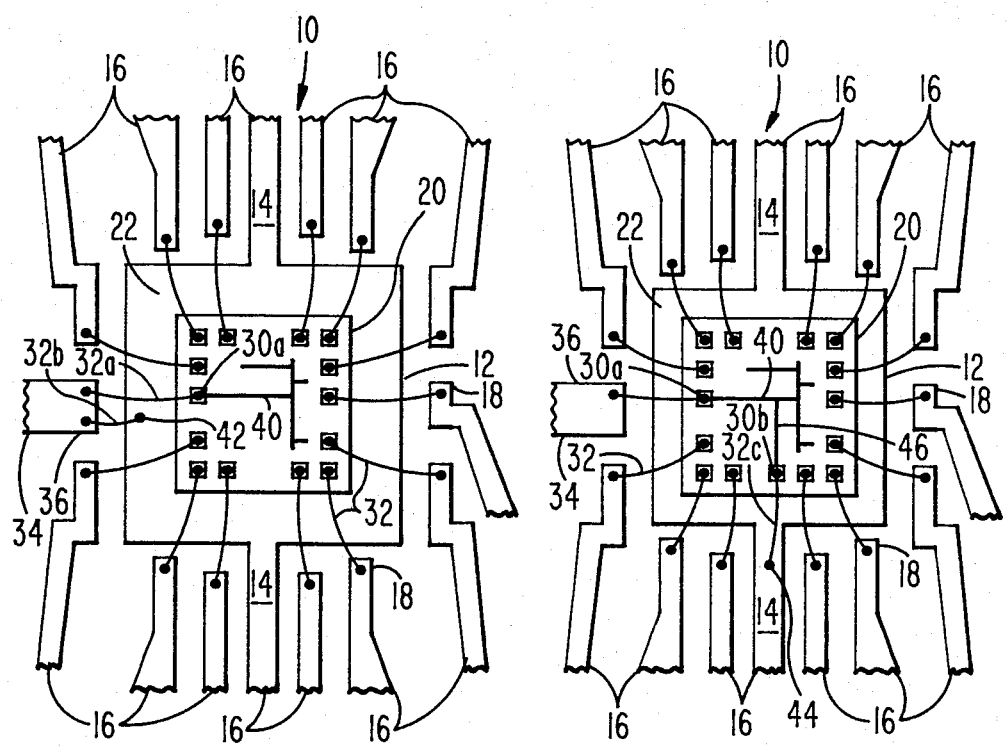
Fig. 1 PRIOR ART
Fig. 2
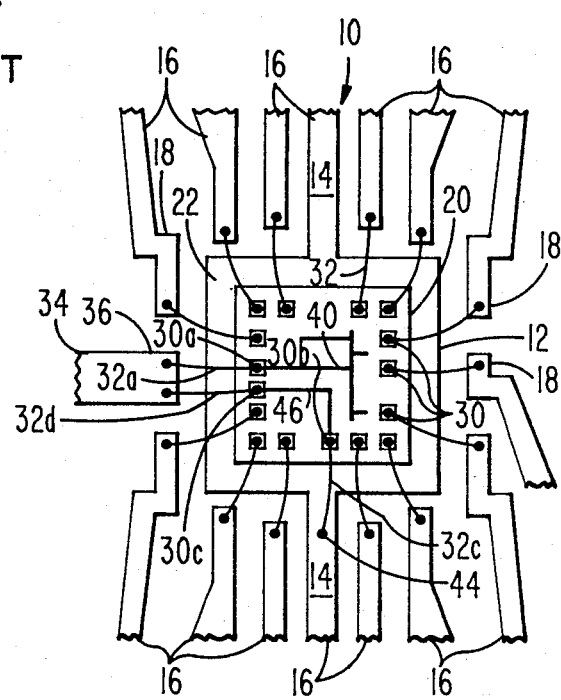
Fig. 3

METHOD FOR GROUNDING A PELLET SUPPORT PAD IN AN INTEGRATED CIRCUIT DEVICE

The present invention relates to semiconductor devices having integrated circuits formed thereon and more particularly to a method for grounding the chip or pellet supporting pad contained in such devices.

BACKGROUND OF THE INVENTION

Certain integrated circuits, due to their application or inherent characteristic structure, are susceptible to extraneous coupling to other devices in the vicinity or exhibit general instability caused by localized charges present on the surface of the device. To overcome these problems, a separate wire conductor is connected between the ground finger lead of the device enclosure and the pad supporting the integrated circuit chip. This generally requires the use of a larger support pad so that there is sufficient clearance between the chip and the edge of the support pad to permit the bonding of a wire in that area. Occasionally, a small portion of the material used to bond the chip onto the mounting pad will overflow and invade this area somewhat. Because the overflow is difficult to control, an additional amount of clearance between the chip and the edge of the support pad is needed.

Where a ground wire is not bonded to the support pad, the typical minimum clearance between the chip and the edge of the support pad is about 5 mils. However, where a ground wire must be bonded to the support pad, the typical minimum clearance is about 15 mils. In a large percentage of the cases where such a ground wire is required the size of the support pad must be increased to the next commercially available size, typically resulting in a 50 % increase, or more, in pad area. What is needed is a method of attaching this ground wire to the support pad without the need to increase the clearance between the chip and the edge of the pad.

SUMMARY OF THE INVENTION

According to the present invention a method for grounding a chip mounting pad in an integrated circuit device to a ground finger is disclosed. The device includes: (1) an integrated circuit chip having a plurality of electrical components and two bond pads formed thereon, said integrated circuit chip being supported by said mounting pad; and (2) a structural member electrically attached to said mounting pad and arranged to support the weight of said mounting pad and said chip. The method comprises the steps of:

(a) Forming a metalized layer on the chip that electrically connects the bond pads.

(b) Attaching a connector wire, one end, of which is connected to a bond pad and the other end to the structural member forming ohmic contacts thereby.

(c) Attaching another connector wire, one end of which is connected to another bond pad and the other end to the ground finger, forming ohmic contacts thereby.

BRIEF DESCRIPTION OF THE DRAWINGS

FIG. 1 is a schematic view depicting a portion of a lead frame having an integrated circuit chip mounted thereon and showing a ground connection to the chip support pad as taught by the prior art;

FIG. 2 is a schematic view similar to that of FIG. 1 showing a ground connection as taught by the present invention; and FIG. 3 is a schematic view similar to that of FIG. 2 showing a variation of the ground connection shown therein.

DESCRIPTION OF THE PREFERRED EMBODIMENT

Referring to FIGS. 1, 2, and 3, there is shown a portion of a lead frame 10 having a chip or pellet mounting pad 12 supported by a pair of structural members 14. As shown, the structural members 14 and mounting pad 12 are of unitary construction thereby providing electrical continuity therebetween. A series of leads 16, each having a contact end 18, are arranged about the periphery of the mounting pad 12 so that the contact ends 18 are spaced apart from and adjacent the pad 12. The lead frame 10 is silver plated and has an outer structure, not shown, that supports the other ends of the leads 16 and the structural members 14. Upon encapsulation of the device and final forming of the leads 16, this outer structure is separated and discarded. Such lead frames, their manufacture and use are well known in the art and therefore will not be further described here.

A pellet, or chip 20 having an integrated circuit formed thereon is bonded to a surface 22 of the mounting pad 12 in a manner well known in the art. A series of small bond pads 30 are formed on the surface of the chip 20 close to its outer edges and adjacent the contact ends 18. The bond pads 30, typically aluminum, are electrically connected to various points within the integrated circuit and are the means by which the integrated circuit is interconnected with other circuitry and devices. Fine connecting wires 32 electrically interconnect the bond pads 30 and the leads 16. The wires 32 are generally gold having a diameter of about 1 mil. One end of each wire is bonded to a pad 30 utilizing thermosonic bonding techniques that are well known in the art, and the other end is similarly bonded to a contact end 18 of an appropriate lead 16. Ultrasonic and thermocompression bonding, which are also well known in the art, may be used, although, thermosonic bonding is preferred.

A ground finger 34 having a contact end 36 arranged adjacent the chip 20 has its other end supported by the outer structure of the lead frame 10 similar to those of the leads 16. A bond pad 30a is electrically interconnected with the ground points of the integrated circuit via the metalized conductors 40 as shown in FIG. 1. A fine connecting wire 32a is bonded to and electrically interconnects the pad 30a and the contact end 36 of the ground finger 34 in the manner described above. It will be understood, however, that the ground finger 34 is electrically independent of the mounting pad 12.

An important feature of the present invention is the manner in which the chip mounting pad 12 is electrically connected to the ground finger 34. The prior art arrangement shown in FIG. 1 depicts a fine connecting wire 32b bonded to the contact end 36 and to a bond point 42 of the mounting pad 12. This, however, requires the use of a larger mounting pad than would otherwise be necessary to assure that sufficient space is available to effect a proper bond at 42. The present invention, on the other hand, effects a similar result by bonding one end of a fine connecting wire 32c to a bond point 44 on one of the structural members 14 and the other end to a bond pad 30b, as shown in FIGS. 2 and 3. The bond pad 30b is then either connected to the ground conductors 40 as shown in FIG. 2, or is connected to another bond pad 30c that is formed on the chip 20 adjacent the ground finger 34, as shown in FIG. 3. This connection is made via a metalized conductor 46. In the latter case, one end of a fine connecting wire 32d is bonded to the pad 30c and the other end is bonded to the contact end 36 of the ground finger 34.

The important advantages realized by employing the above described structure are that the chip mounting pad 12 is significantly smaller and the gold connecting wires 32 are significantly shorter than those of the prior art case. Most importantly, the shorter connecting wires 32 are less susceptible to flexing during incapsulation thereby enhancing the integrity of the bonded connections. Further, the integrity of the mounting pad ground connection is also enhanced because, (1) due to the location of the bond point 44, there is no possibility of interference by overflow of the material used to bond the chip onto the mounting pad and (2) the ground connecting wire 32c is bonded at one end to an aluminum bonding pad on the chip and at the other end to a silver bond point on one of the structural members 14 similar to the bonding arrangement of all the other fine connecting wires 32. This obviates the need of a bonding operation different for the mounting pad ground connecting wire from that of all the other connecting wires as in the prior art case.

By way of example, the RCA integrated circuit pellet CA3084 is conventionally mounted on a lead frame having a mounting pad with a surface area of approximately $1.00 \times 10^{-2}$ in.$^2$. In this configuration the mounting pad is grounded by a connector wire that has one end bonded to the ground finger and the other end bonded to the mounting pad in the area between the side of the pellet and the edge of the mounting pad. By employing the teachings of the present invention, on the other hand, the same pellet may be mounted in a lead frame having a mounting pad with a surface area of approximately $6.40 \times 10^{-3}$ in.$^2$ resulting in a 36% reduction in mounting pad size over that of the conventional arrangement. Similarly, the length of the gold connector wires in the conventional arrangement average approximately $7.52 \times 10^{-2}$ inches long while in the case of the present invention they average approximately $6.45 \times 10^{-2}$ inches long for a 14% reduction in connector wire length. This highlights an additional benefit of reduced cost of manufacture.

I claim:

1. In a method of grounding a mounting pad in an integrated circuit device to a ground finger which is electrically isolated from and adjacent said mounting pad, said device including: (1) an integrated circuit chip having a plurality of electrical components and two bond pads formed thereon, said integrated circuit chip being supported by said mounting pad and (2) a structural member attached to said mounting pad so that electrical continuity exists therebetween and arranged to support the weight of said mounting pad and said chip, said structural member being electrically isolated from said ground finger, the steps comprising:

(a) forming a metalized layer on said chip electrically connecting said two bond pads;

(b) attaching one end of a first connector wire to one of said two bond pads, and the other end of said first connector wire to said structural member; and (c) attaching one end of a second connector wire to the other of said two bond pads, and the other end of said second connector wire to said ground finger; wherein each of said attaching effects ohmic connections.

2. The method set forth in claim 1 wherein said device includes a third bond pad formed on said chip and being electrically independent of said two bond pads including the steps of:

attaching one end of another connector wire to said third bond pad, and the other end of said another connector wire to said ground finger.

3. The method set forth in claim 1 including the step of:

forming a metalized layer on said chip electrically connecting one of said two bond pads to one of said electrical components.

4. The method set forth in claim 2 wherein said attaching is effected by thermocompression bonding.

5. The method set forth in claim 2 wherein said attaching is effected by ultrasonic bonding.

6. The method set forth in claim 2 wherein said attaching is effected by themosonic bonding.

7. An improved integrated circuit device including: (1) an integrated circuit chip having a plurality of electrical components and two bond pads fomed thereon; (2) a mounting pad for supporting said chip; (3) a structural member electrically attached to said mounting pad and arranged to support the weight of said mounting pad and said chip; and (4) a ground finger electrically independent of both said mounting pad and said structural member and adjacent said mounting pad, wherein the improvement comprises:

(a) a metalized layer on said chip electrically connecting said two bond pads;

(b) a first connector wire, one end of which is electrically connected to one of said two bond pads and the other end of which is electrically connected to said structural member; and (c) a second connector wire, one end of which is electrically connected to the other of said two bond pads and the other end of which is electrically connected to said ground finger.

8. The device set forth in claim 7 including a third bond pad formed on said chip electrically independent of said two bond pads and another connector wire, one end of which is electrically connected to said third bond pad and the other end which is electrically connected to said ground finger.

9. The device set forth in claim 7 including a metalized layer formed on said chip electrically connecting one of said two bond pads to one of said electrical components.

10. The device set forth in claim 8 wherein said connector wires are connected by thermocompression bonding.

11. The device set forth in claim 8 wherein said connector wires are connected by ultrasonic bonding.

12. The device set forth in claim 8 wherein said connector wires are connected by thermosonic bonding.

* * * * *